(12) United States Patent
Calafut

(10) Patent No.: US 7,625,793 B2
(45) Date of Patent: Dec. 1, 2009

(54) POWER MOS DEVICE WITH IMPROVED GATE CHARGE PERFORMANCE

(75) Inventor: Daniel S. Calafut, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/236,112

(22) Filed: Sep. 26, 2005

(65) Prior Publication Data

US 2006/0024890 A1 Feb. 2, 2006

Related U.S. Application Data

(60) Continuation of application No. 10/391,126, filed on Mar. 17, 2003, now abandoned, which is a continuation of application No. 10/219,603, filed on Aug. 14, 2002, now Pat. No. 6,534,825, which is a division of application No. 09/468,269, filed on Dec. 20, 1999, now Pat. No. 6,461,918.

(51) Int. Cl.
H01L 21/8238 (2006.01)
H01L 21/336 (2006.01)
(52) U.S. Cl. .............. 438/212; 438/268; 438/270; 438/589; 257/E21.41; 257/E21.629
(58) Field of Classification Search .......... 438/259, 438/289, 430, 301, 589, 212, 268, 270; 257/E21.429, 257/E21.444, E21.41
See application file for complete search history.

(56) References Cited

U.S. PATENT DOCUMENTS 3,404,295 A 10/1968 Warner et al.
3,412,297 A 11/1968 Amlinger
3,497,777 A 2/1970 Teszner at al.

(Continued)

FOREIGN PATENT DOCUMENTS

CN 1036666 A 10/1989

(Continued)

OTHER PUBLICATIONS

Bai et al., "Novel automated optimization of power MOSFET for 12V input, high-frequency DC-DC converter," *International Symposium on Power Semidconductors and ICs, Technical Digest*, (2003), pp. 366-369.

(Continued)

*Primary Examiner*—Walter L Lindsay, Jr.
*Assistant Examiner*—Ron E Pompey
(74) *Attorney, Agent, or Firm*—Townsend and Townsend and Crew LLP

(57) ABSTRACT

A double-diffused metal-oxide-semiconductor ("DMOS") field-effect transistor with an improved gate structure. The gate structure includes a first portion of a first conductivity type for creating electron flow from the source to the drain when a charge is applied to the gate. The gate structure includes a second portion of a second conductivity type having a polarity that is opposite a polarity of the first conductivity type, for decreasing a capacitance charge under the gate. A second structure for decreasing a capacitance under the gate includes an implant region in the semiconductor substrate between a channel region, where the implant region is doped to have a conductivity opposite the channel region.

8 Claims, 8 Drawing Sheets

U.S. PATENT DOCUMENTS

| | | | |
|---|---|---|---|
| 3,564,356 A | 2/1971 | Wilson | |
| 3,660,697 A | 5/1972 | Berglund et al. | |
| 4,003,072 A | 1/1977 | Matsushita et al. | |
| 4,011,105 A | 3/1977 | Palvinen et al. | |
| 4,300,150 A | 11/1981 | Colak | |
| 4,324,038 A * | 4/1982 | Chang et al. | 438/282 |
| 4,326,332 A | 4/1982 | Kenney et al. | |
| 4,337,474 A | 6/1982 | Yukimoto | |
| 4,345,265 A | 8/1982 | Blanchard | |
| 4,445,202 A | 4/1984 | Geotze et al. | |
| 4,568,958 A | 2/1986 | Baliga | |
| 4,579,621 A | 4/1986 | Hine | |
| 4,636,281 A | 1/1987 | Buiguez et al. | |
| 4,638,344 A | 1/1987 | Cardwell, Jr. | |
| 4,639,761 A | 1/1987 | Singer et al. | |
| 4,673,962 A | 6/1987 | Chatterjee et al. | |
| 4,698,653 A | 10/1987 | Cardwell, Jr. | |
| 4,716,126 A | 12/1987 | Cogan | |
| 4,745,079 A | 5/1988 | Pfiester | |
| 4,746,630 A | 5/1988 | Hui et al. | |
| 4,754,310 A | 6/1988 | Coe | |
| 4,767,722 A | 8/1988 | Blanchard | |
| 4,774,556 A | 9/1988 | Fujii et al. | |
| 4,801,986 A | 1/1989 | Chang et al. | |
| 4,821,095 A | 4/1989 | Temple | |
| 4,823,176 A | 4/1989 | Baliga et al. | |
| 4,824,793 A | 4/1989 | Richardson et al. | |
| 4,853,345 A | 8/1989 | Himelick | |
| 4,868,624 A | 9/1989 | Grung et al. | |
| 4,893,160 A | 1/1990 | Blanchard | |
| 4,914,058 A | 4/1990 | Blanchard | |
| 4,941,026 A | 7/1990 | Temple | |
| 4,961,100 A | 10/1990 | Baliga et al. | |
| 4,967,245 A | 10/1990 | Cogan et al. | |
| 4,969,028 A | 11/1990 | Baliga | |
| 4,974,059 A | 11/1990 | Kinzer | |
| 4,990,463 A | 2/1991 | Mori | |
| 4,992,390 A | 2/1991 | Chang | |
| 5,027,180 A | 6/1991 | Nishizawa et al. | |
| 5,034,785 A | 7/1991 | Blanchard | |
| 5,065,273 A | 11/1991 | Rajeevakumar | |
| 5,071,782 A | 12/1991 | Mori | |
| 5,072,266 A | 12/1991 | Buluccea | |
| 5,079,608 A | 1/1992 | Wodarczyk et al. | |
| 5,105,243 A | 4/1992 | Nakagawa et al. | |
| 5,111,253 A | 5/1992 | Korman et al. | |
| 5,134,448 A | 7/1992 | Johnsen et al. | |
| 5,142,640 A | 8/1992 | Iwanatsu | |
| 5,156,989 A | 10/1992 | Williams et al. | |
| 5,164,325 A | 11/1992 | Cogan et al. | |
| 5,164,802 A | 11/1992 | Jones et al. | |
| 5,168,331 A | 12/1992 | Yilmaz | |
| 5,168,973 A | 12/1992 | Asayama et al. | |
| 5,188,973 A | 2/1993 | Omura et al. | |
| 5,208,657 A | 5/1993 | Chatterjee et al. | |
| 5,216,275 A | 6/1993 | Chen | |
| 5,219,777 A | 6/1993 | Kang | |
| 5,219,793 A | 6/1993 | Cooper et al. | |
| 5,233,215 A | 8/1993 | Baliga | |
| 5,242,845 A | 9/1993 | Baba et al. | |
| 5,250,450 A | 10/1993 | Lee et al. | |
| 5,262,336 A | 11/1993 | Pike, Jr. et al. | |
| 5,268,311 A | 12/1993 | Euen et al. | |
| 5,275,961 A | 1/1994 | Smayling et al. | |
| 5,275,965 A | 1/1994 | Manning | |
| 5,281,548 A | 1/1994 | Prall | |
| 5,294,824 A | 3/1994 | Okada | |
| 5,298,781 A | 3/1994 | Cogan et al. | |
| 5,300,447 A | 4/1994 | Anderson | |
| 5,300,452 A | 4/1994 | Chang et al. | |
| 5,326,711 A | 7/1994 | Malhl | |
| 5,346,834 A | 9/1994 | Hisamoto et al. | |
| 5,350,937 A | 9/1994 | Yamazaki et al. | |
| 5,365,102 A | 11/1994 | Mehrotra et al. | |
| 5,366,914 A | 11/1994 | Takahashi et al. | |
| 5,389,815 A | 2/1995 | Takahashi | |
| 5,405,794 A | 4/1995 | Kim | |
| 5,418,376 A | 5/1995 | Muraoka et al. | |
| 5,424,231 A | 6/1995 | Yang | |
| 5,429,977 A | 7/1995 | Lu et al. | |
| 5,430,311 A | 7/1995 | Murakami et al. | |
| 5,430,324 A | 7/1995 | Bencuya | |
| 5,434,435 A | 7/1995 | Baliga | |
| 5,436,189 A | 7/1995 | Beasom | |
| 5,438,007 A | 8/1995 | Vinal et al. | |
| 5,438,215 A | 8/1995 | Tihanyi | |
| 5,442,214 A | 8/1995 | Yang | |
| 5,473,176 A | 12/1995 | Kakumoto | |
| 5,473,180 A | 12/1995 | Ludikhuize | |
| 5,474,943 A | 12/1995 | Hshieh et al. | |
| 5,488,010 A | 1/1996 | Wong | |
| 5,519,245 A | 5/1996 | Tokura et al. | |
| 5,541,425 A | 7/1996 | Nishihara | |
| 5,554,552 A | 9/1996 | Chi | |
| 5,554,862 A | 9/1996 | Omura et al. | |
| 5,567,634 A | 10/1996 | Hebert et al. | |
| 5,567,635 A | 10/1996 | Acovic et al. | |
| 5,572,048 A | 11/1996 | Sugawara | |
| 5,576,245 A | 11/1996 | Cogan et al. | |
| 5,578,851 A | 11/1996 | Hshieh et al. | |
| 5,581,100 A | 12/1996 | Ajit | |
| 5,583,065 A | 12/1996 | Miwa | |
| 5,592,005 A | 1/1997 | Floyd et al. | |
| 5,593,909 A | 1/1997 | Han et al. | |
| 5,595,927 A | 1/1997 | Chen et al. | |
| 5,597,765 A | 1/1997 | Yilmaz et al. | |
| 5,599,728 A * | 2/1997 | Hu et al. | 438/289 |
| 5,602,049 A * | 2/1997 | Wen et al. | 438/238 |
| 5,605,852 A | 2/1997 | Bencuya | |
| 5,616,945 A | 4/1997 | Williams | |
| 5,623,152 A | 4/1997 | Majumdar et al. | |
| 5,629,543 A | 5/1997 | Hshieh et al. | |
| 5,637,898 A | 6/1997 | Baliga | |
| 5,639,676 A | 6/1997 | Hshieh et al. | |
| 5,640,034 A | 6/1997 | Malhi | |
| 5,648,670 A | 7/1997 | Blanchard | |
| 5,656,843 A | 8/1997 | Goodyear et al. | |
| 5,665,619 A | 9/1997 | Kwan et al. | |
| 5,670,803 A | 9/1997 | Beilstein, Jr. et al. | |
| 5,684,320 A | 11/1997 | Kawashima | |
| 5,689,128 A | 11/1997 | Hshieh et al. | |
| 5,693,569 A | 12/1997 | Ueno | |
| 5,705,409 A | 1/1998 | Witek | |
| 5,710,072 A | 1/1998 | Krautschneider et al. | |
| 5,714,781 A | 2/1998 | Yamamoto et al. | |
| 5,717,237 A | 2/1998 | Chi | |
| 5,719,409 A | 2/1998 | Singh et al. | |
| 5,744,372 A | 4/1998 | Bulucea | |
| 5,767,004 A | 6/1998 | Balasubramanian et al. | |
| 5,770,878 A | 6/1998 | Beasom | |
| 5,776,813 A | 7/1998 | Huang et al. | |
| 5,780,343 A | 7/1998 | Bashir | |
| 5,801,417 A | 9/1998 | Tsang et al. | |
| 5,814,858 A | 9/1998 | Williams | |
| 5,821,583 A | 10/1998 | Hshieh et al. | |
| 5,877,528 A | 3/1999 | So | |
| 5,879,971 A | 3/1999 | Witek | |
| 5,879,994 A | 3/1999 | Kwan et al. | |
| 5,894,157 A | 4/1999 | Han et al. | |
| 5,895,951 A | 4/1999 | So et al. | |
| 5,895,952 A | 4/1999 | Darwish et al. | |
| 5,897,343 A | 4/1999 | Mathew et al. | |
| 5,897,360 A | 4/1999 | Kawaguchi | |
| 5,900,663 A | 5/1999 | Johnson et al. | |

| Patent No. | Date | Inventor(s) |
|---|---|---|
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,097,063 A | 8/2000 | Fujihira |
| 6,098,608 A | 8/2000 | Williams |
| 6,103,578 A | 8/2000 | Uenishi et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,150,693 A * | 11/2000 | Wollesen .................. 257/330 |
| 6,150,697 A | 11/2000 | Teshigahara et al. |
| 6,156,606 A | 12/2000 | Michaells |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,719 B1 * | 5/2001 | Frisina et al. ............ 438/268 |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,265,269 B1 | 7/2001 | Chen et al. |
| 6,271,100 B1 | 8/2001 | Ballantine et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 8,271,552 | 8/2001 | D'Anna |
| 8,271,562 | 8/2001 | Deboy et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 8,309,920 | 10/2001 | Laska at al. |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 8,351,018 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,452,230 B1 | 9/2002 | Boden, Jr. |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,534,825 B2 | 3/2003 | Calafut |
| 6,548,856 B1 * | 4/2003 | Lin et al. .................. 257/315 |
| 6,566,804 B1 | 5/2003 | Trujillo et al. |
| 6,580,123 B2 | 6/2003 | Thapar |
| 6,608,350 B2 | 8/2003 | Kinzer et al. |
| 6,614,074 B2 * | 9/2003 | Bronner et al. ............. 257/330 |
| 6,657,254 B2 | 12/2003 | Hshieh et al. |
| 6,677,641 B2 | 1/2004 | Kocon |
| 6,683,346 B2 | 1/2004 | Zeng |
| 6,720,618 B2 | 4/2004 | Hirler et al. |
| 6,806,533 B2 | 10/2004 | Henninger et al. |
| 6,833,584 B2 | 12/2004 | Henninger et al. |
| 2001/0023961 A1 | 9/2001 | Hsieh et al. |
| 2001/0026989 A1 | 10/2001 | Thapar |

| | | | |
|---|---|---|---|
| 2001/0028083 | A1 | 10/2001 | Onishi et al. |
| 2001/0032998 | A1 | 10/2001 | Iwamoto et al. |
| 2001/0041400 | A1 | 11/2001 | Ren et al. |
| 2001/0049167 | A1 | 12/2001 | Madson |
| 2001/0050394 | A1 | 12/2001 | Onishi et al. |
| 2002/0009832 | A1 | 1/2002 | Blanchard |
| 2002/0014658 | A1 | 2/2002 | Blanchard |
| 2002/0066924 | A1 | 6/2002 | Blanchard |
| 2002/0070418 | A1 | 6/2002 | Kinzer et al. |
| 2002/0100933 | A1 | 8/2002 | Marchant |
| 2003/0060013 | A1 | 3/2003 | Marchant |
| 2003/0132450 | A1 | 7/2003 | Minato et al. |
| 2003/0193067 | A1 | 10/2003 | Kim |
| 2003/0209757 | A1 | 11/2003 | Henninger et al. |
| 2004/0031987 | A1 | 2/2004 | Henninger et al. |
| 2004/0089910 | A1 | 5/2004 | Hirler et al. |
| 2004/0232407 | A1 | 11/2004 | Calafut |
| 2005/0017293 | A1 | 1/2005 | Zundel et al. |

FOREIGN PATENT DOCUMENTS

| | | |
|---|---|---|
| DE | 4300806 C1 | 12/1993 |
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 56-058267 A | 5/1981 |
| JP | 62-069562 | 3/1987 |
| JP | 63-186475 | 8/1988 |
| JP | 63-288047 | 11/1988 |
| JP | 64-022051 | 1/1989 |
| JP | 01-192174 A | 8/1989 |
| JP | 05-226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 5/2002 |

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET Integral diodes by electron Irradiation," (Dec. 1983) Solid State Electronics, vol. 28, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenberg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of $1m\Omega$ $cm^2$," IEEE Transactions on Electron Devices 34:2329-2334 (1987).

Cheng et al., "Fast reverse recovery body diode in high-voltage VDMOSFET using cell-distributed schottky contacts," (May 2003) IEEE Transactions on Electron Devices, vol. 50, No. 5, pp. 1422-1425.

"CoolMOS™ the second generation," Infineon Technologies product Information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance, ISPSD Proceedings—Apr. 2003, Cambridge. 4 pages total.

Djekic, O. et al., "High frequency synchronous buck converter for low voltage applications," (1998) Proc. IEEE Power Electronics Specialist Conf. (PESC), pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-21 2001, Vancouver, Canada (2001), 4 pages total.

Glenn et al. "A Novel Vertical Deep Trench RESURF DMOS (VTRDMOS)" IEEE ISPD 2000, May 22-25, Toulouse France, pp. 197-200.

"1R develops CoolMOS™-equivalent technology, positions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", IEEE Transactions in Electron Devices, vol. ED-34,No. 5, May 1987, pp. 1008-1017.

Kao et al. "Two Dimensional Thermal Oxidation of Silicon-II. Modeling Stress Effects in Wet Oxides," IEEE Transactions on Electron Devices, vol. ED-35, No. 1, Jan. 1988, pp. 25-37.

Kassakian, J.G. et al., "High-frequency high-density converters for distributed power supply systems," (Apr. 1988) Proceedings of the IEEE, vol. 76, No. 4, pp. 362-376.

Korman, C.S. et al., "High performance power DMOSFET with integrated schottky diode," (1989) Proc. IEEE Power Electronics Specialist Conf. (PESC), pp. 176-179.

Lorenz et al., "COOL MOS- An important milestone towards a new power MOSFET generation" Power Conversion pp. 151-160 (1988).

Maksimovic, A.M. et al., "Modeling and simulation of power electronic converters," (Jun. 2001) Proceedings of the IEEE, vol. 89, No. 6, pp. 898-912.

Mehrotra, M. et al., "Very low forward drop JBS rectifiers fabricated using submicron technology," (Nov. 1993) IEEE Transactions on Electron Devices, vol. 40, No. 11, pp. 2131-2132.

Miller, "Power Management & Supply—Market, Applications Technologies—an Overview," Infineon Technologies, downloaded from the Internet <<http://www.ewh.ieee.org/r8/germany/las-pels/m_regensburg/overview_miller.pdf>>, May 5, 2003, 53 pages total.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental Investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

* cited by examiner

POWER MOS DEVICE WITH IMPROVED GATE CHARGE PERFORMANCE

CROSS-REFERENCES TO RELATED APPLICATIONS

This application is a continuation of U.S. patent application Ser. No. 10/391,126, filed on Mar. 17, 2003, which is a continuation of U.S. patent application Ser. No. 10/219,603, filed on Aug. 14, 2002, now U.S. Pat. No. 6,534,825, which is a division of U.S. patent application Ser. No. 09/468,269 filed on Dec. 20, 1999, now U.S. Pat. No. 6,461,918, which disclosures are incorporated herein by reference in their entirety for all purposes.

BACKGROUND OF THE INVENTION

The present invention relates to field-effect transistors, in particular double-diffused metal-oxide-semiconductor ("DMOS") transistors, and their method of manufacture.

A DMOS transistor is a type of field-effect transistor ("FET") that can be used as a power transistor, that is, a transistor that is used to switch or control relatively large amounts of electrical power compared to a transistor that might be used in a logic circuit application. Power transistors might operate between 1-1000 volts, or higher, and might carry from several tenths of an amp to several amps of current, or higher. Power MOSFETs are designed to operate under conditions that would destroy conventional MOSFETs, or accelerate their failure.

Design of DMOS transistors presents challenges over other conventional MOS transistor devices, in particular relating to the structure of the channel and drain regions. FIGS. 1 and 2 illustrate a conventional trench DMOS transistor 100 and planar DMOS transistor 200, respectively. FIG. 1 shows a semiconductor substrate 102 with a trench 110 formed to a predetermined depth into the substrate. At the bottom of the substrate is an n+ drain region 120. Above the drain is an epitaxial layer 125 doped to a lighter degree of the same conductivity as the drain region. Overlying the epitaxial region is a channel region 105 implanted with a dopant having a polarity that is opposite the substrate and epitaxial regions. As illustrated in FIG. 1, the dopant profile ranges from a lesser degree to a greater degree away from the trench, to where a concentration of dopant forms a body region.

Formed near the surface of the substrate on either side of the trench are source regions 130, implanted with a dopant of the same conductivity type as the drain. Source and drain regions of the transistor shown in FIG. 1 are illustrated as n+, the channel region as p−, and a body region as p+. It should be readily apparent to a person skilled in the art that the polarity of the conductivity type for the transistor structure could be reversed. A dielectric layer 112 lines the trench. Filling the trench over the dielectric layer is a gate 114, which is typically made of polysilicon material doped to a similar conductivity type as the source and drain regions.

In operation, a charge applied to the gate creates a channel for electron migration across a channel 132 alongside the trench between the sources 130 and the epitaxial region 125, and flowing to the drain 120. The charge applied to the gate also forms an accumulation area 134 in the epitaxial layer under the trench, where electrons accumulate.

FIG. 2 illustrates a conventional planar DMOS transistor 200 fabricated on a semiconductor substrate 202. An n+ drain region lies at the bottom of the substrate. Overlying the drain is an n− epitaxial layer 225. Source regions 230 are formed of an implant of n+ dopants into an area just below the top surface of the substrate. Surrounding each source region underneath are P-type channel regions 205, which form a channel 232 between the source and the epitaxial layer. At least partially overlying each source region is a dielectric layer 212. Coextensively overlying the dielectric layer is a polysilicon gate 214 implanted with dopants of the same conductivity type as the source regions.

A charge applied to the gate causes electrons to flow from the sources, across the channels to the epitaxial region, and then down to the drain. Because of the uniform charge on the gate, an accumulation of electrons forms at the surface in the epitaxial layer just below the gate, between the channel regions, in an accumulation area 234.

An important design issue for both trench and planar DMOS transistors is the gate charge required to drive the gate of the MOSFET to a specific voltage. FIG. 3 illustrates an ideal gate charge curve for a conventional DMOS transistor. In a particular range, denoted as the Miller Q range, additional charge on the gate is insufficient to overcome certain parasitic capacitance that arise during operation. Several important ones of the parasitic capacitance are labeled in FIGS. 1 and 2. A capacitance between the gate and the source, $C_{gs}$, forms in the area where the gate overlaps the source. A gate-to-drain capacitance, $C_{gd}$, forms between the gate and the accumulation region, where electrons accumulate as a current path is formed from the channel region to the drain.

The capacitance $C_{gd}$ is also known as the "Miller capacitance." The Miller capacitance is an effective build-up of capacitive charge which must be overcome in order to bias the transistor to a particular voltage, as shown in FIG. 3. Increasing the gate charge has adverse effects. Transistor switching speed is significantly reduced where a larger gate charge is required. Further, the failure rate of transistors subject to higher gate charge is increased. Thus, it is desired to minimize the Miller capacitance over a range of charge, so as to reduce the gate charge and enhance transistor switching speed, efficiency, and improve failure rates.

One method of reducing the Miller capacitance is shown in U.S. Pat. No. 5,879,994, which describes a process and structure to apply a non-uniform gate dielectric layer, where a thicker oxide is applied over the accumulation area, and a thinner oxide is formed over the inversion channel area. The extra-thick oxide, or "terrace oxide" over the region where the Miller capacitance occurs, has some limitations. First, for planar DMOS transistors, alignment of the terrace oxide is difficult to achieve, and adds significantly to the costs of manufacturing the devices. Being easily misaligned, transistors formed with a terrace oxide have substantially lower yields. The difficulty with which to build a non-uniform dielectric layer exists in trench DMOS structures as well.

An alternative approach for reducing the Miller capacitance begins by considering voltage-dependent capacitance characteristics of MOS devices under various gate bias conditions. FIG. 4 shows a well-known CV curve for a conventional MOS device. At the extremes of the applied gate voltage $|V_g|$, the capacitance value maintains a constant value that depends only on the thickness of the dielectric (assumed to be $SiO_2$, although not limited herein as such). This is due to a layer of mobile charge, at the extreme points on the curve, which causes the interface between the dielectric and the silicon substrate to effectively become a second plate of a capacitor.

As the gate voltage approaches a value known as the "flat band" voltage, as viewed from the accumulation side, the capacitance begins to decrease until a point called the "threshold" voltage is reached. This point is reached when the mobile charge distribution near the $SiO_2$—Si interface transitions from accumulation to inversion. Beyond the threshold voltage $V_t$, the area immediately around the $SiO_2$—Si interface is said to be inverted and there is again a layer of mobile charge, albeit of opposite polarity. In this range the MOS capacitance is limited by the gate oxide thickness.

Close to the threshold $V_t$, there is a point $C_{min}$ that represents the lowest value of capacitance for a given gate bias voltage in conventional MOS devices. However, a novel DMOS structure could be made so as to shift $C_{min}$ to as near the $V_{gs}$ value range for the Miller region shown in FIG. 3. This would lower the capacitance within the Miller range, and effectively decrease the range of charge needed to overcome the Miller capacitance.

BRIEF SUMMARY OF THE INVENTION

The present invention provides a method of fabricating a gate structure of a DMOS device. The fabrication method includes the steps of forming a polysilicon gate on a portion of a semiconductor substrate, implanting a dopant of a first conductivity type into the polysilicon gate, masking the polysilicon gate to define an alternation region within the gate, and implanting a dopant of a second conductivity type into the alternation region, where the second conductivity type has an electrical polarity opposite a polarity of the first conductivity type.

In another embodiment, the present invention provides a gate of a semiconductor device that includes a polysilicon gate structure overlying a channel region in a semiconductor substrate and extending at least partially over a source formed in the substrate adjacent the channel region. The polysilicon gate structure has a first portion being of a first conductivity type and a second portion being of a second conductivity type defining an alternation region. The second conductivity type has a polarity that is opposite a polarity of the first conductivity type.

In yet another embodiment, the present invention provides a method of fabricating a gate structure of a trench-type DMOS device. The method includes the steps of forming a trench in a semiconductor substrate, lining the trench with a dielectric layer, and forming a first polysilicon gate portion to an intermediate depth of the trench. The method further includes the steps of implanting a dopant of a first conductivity type into the first gate portion, forming a second polysilicon gate portion in the trench over the first gate structure to a level substantially equal to a top surface of the silicon substrate, and implanting a dopant of a second conductivity type into the second gate portion.

In still yet another embodiment, the present invention provides a composite gate structure in a trench transistor. The composite gate structure includes a trench extending a selected depth from a top surface of a semiconductor substrate, a conformal dielectric layer lining the trench, a first gate portion disposed over the dielectric layer and extending from the bottom to an intermediate depth of the trench, the first gate portion having a first conductivity type, and a second gate portion disposed over the first gate portion and the dielectric layer, and extending from the intermediate depth to the top surface, the second gate portion having a second conductivity type that is of an opposite polarity from the first conductivity type.

In still yet another embodiment, the present invention provides a semiconductor device having a channel region of a first conductivity type formed by diffusing a dopant of the first conductivity type into a substrate having a second conductivity type, a gate dielectric disposed on the substrate, and an implant region of a second conductivity type formed by diffusing a dopant of the second conductivity type under the gate dielectric, the second conductivity type having a polarity opposite a polarity of the first conductivity type.

DETAILED DESCRIPTION OF THE INVENTION

The present invention provides a composite gate structure and methods of manufacture. The composite gate structure lowers gate to drain overlap capacitance and enhances switching speed and efficiency.

Figure 5:
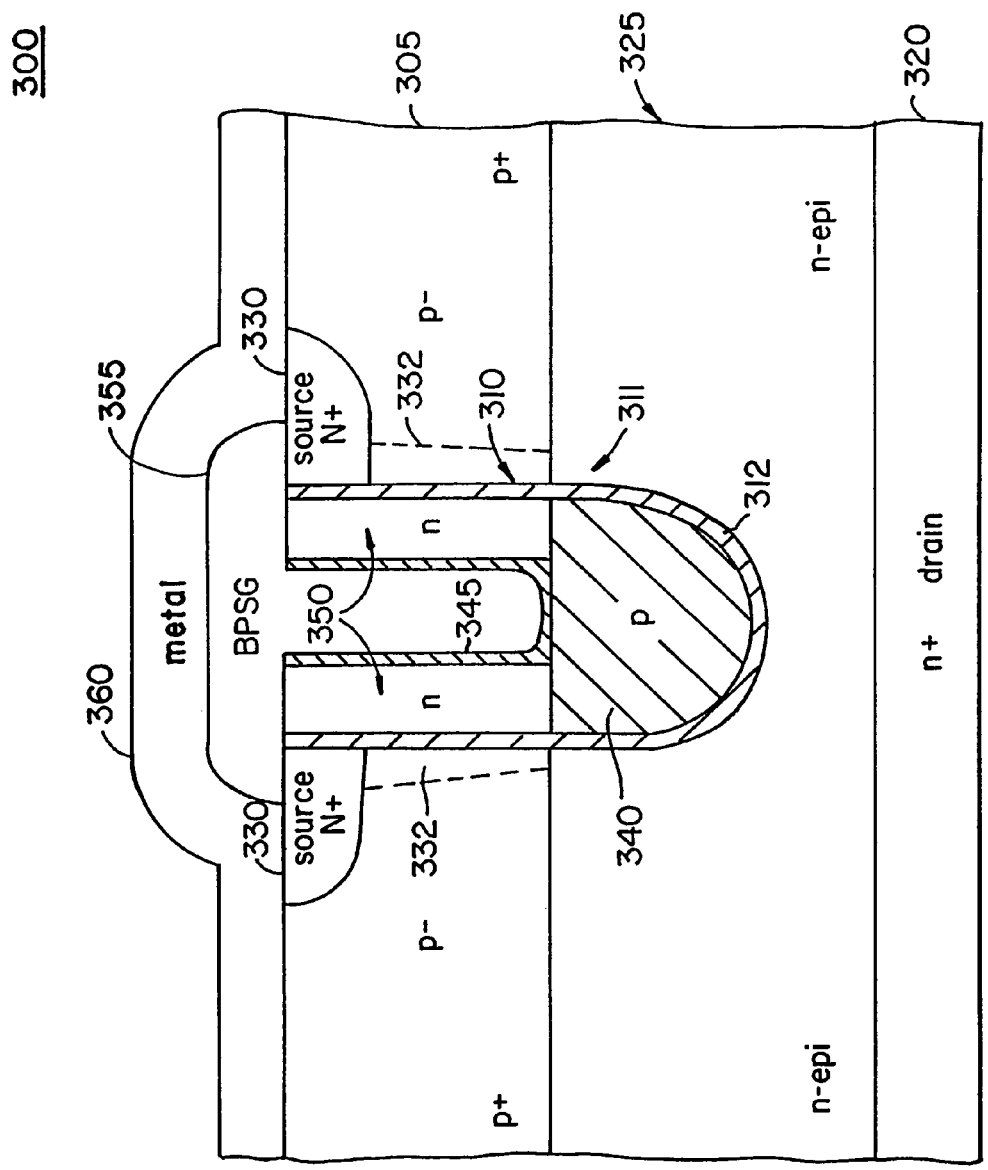
FIG. 5 is a simplified cross section of a trench DMOS transistor according to the present invention.

FIG. 5 is a simplified cross section of a trench DMOS transistor 300 according to an embodiment of the present invention. This example illustrates an n– channel device, however, it is understood that the invention could be applied to an p– channel device. The DMOS transistor is fabricated on an n+ silicon substrate 320 that serves as the drain of the DMOS transistor. An n– epitaxial layer 325 is grown on the substrate. A p– channel region 332 and a p+ body region 305 are formed over the n– epitaxial layer, which is considered part of the "substrate" for purposes of this description. The p– channel region and p+ body region are formed by implanting and diffusing dopants of a p-type conductivity.

A trench 310 is formed into the substrate to a predetermined depth, extending into the n– epitaxial layer. N+ source regions are implanted and diffused into both the p+ body region and the p– channel region, as well as adjacent to opposing sides of the trench at the top surface of the substrate. A gate oxide 312 is deposited over the walls of the trench, and a composite gate structure 311 fills the trench over the gate oxide.

According to embodiments of the present invention, the gate structure is initially formed of a first portion 340, deposited into the trench, preferably from the bottom of the trench to a depth substantially corresponding to a depth of the n– epitaxial layer. According to one embodiment of the invention, the first portion is a polysilicon grown in the trench, and a p-type dopant is implanted directly into the trench into the polysilicon. The first portion is doped with a sufficient amount of implant to minimize the capacitance in the accumulation area for a certain predetermined voltage, such as 1 volt.

A second portion 350 of the gate structure is grown on top of the first portion. As illustrated in FIG. 5, the second portion is preferably etched in the middle down to the first portion. A conformal polycide layer 345 is then deposited over sides of the second portions and the top of the first portion. The polycide layer acts to short out the second portion, which would otherwise be floating, or basically cuts the portion in half to divide it into two isolated cells. An insulator 355 is then formed over the polycide layer in the trench, as well as over the top of the trench and at least partially extending over the source regions on the surface of the substrate. In a preferred embodiment, the insulator is boro-phospho silicon glass (BPSG), but also may be any material exhibiting generally nonconductive properties, such as silicon dioxide ($SiO_2$). A metal layer 360 is formed on the top of the substrate and over the insulator, to provide electrical contact to the source regions.

Figure 6:
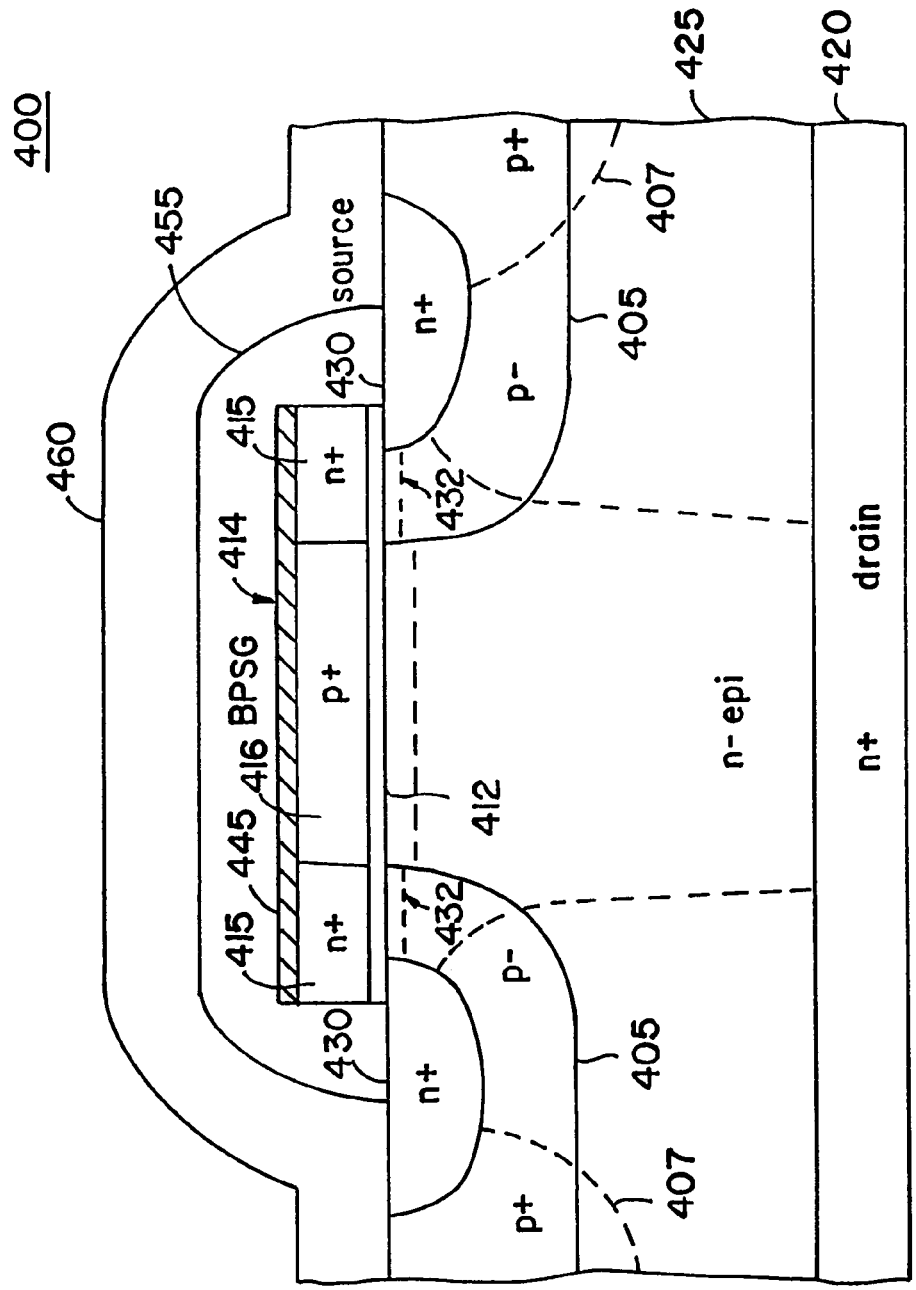
FIG. 6 is a simplified cross section of a planar DMOS transistor according to the present invention.

FIG. 6 is a simplified cross section of a planar DMOS transistor 400 according to an embodiment of the present invention. The DMOS transistor is illustrated in FIG. 6 to show the composite gate structure in an n-channel transistor, but it is understood the invention could equally be applied to a p-channel transistor by reversing most of the polarities of the portions of the transistor.

An n+ region 420 serves as the drain of the planar DMOS transistor, just as in the trench case. An n− epitaxial layer 425 is grown on the n+ region. A p− channel region 405 and a p+ body region 407 are formed in the substrate in the epitaxial layer, and defining an accumulation area in the epitaxial layer therebetween. The channel and body regions are doped according to a predetermined doping profile that need not be further explained here. N+ source regions 430 are implanted and diffused into each of both the channel region and body region, as well as laterally under a gate structure 414. A gate oxide 412 is grown over the p-channel regions and the accumulation area.

The gate structure is formed over the gate oxide, preferably of a deposited and etched polysilicon layer. In a preferred embodiment, the polysilicon gate structure is implanted with a dopant of a first conductivity type to yield a polarity of n+. The gate structure is then masked, and a dopant of a second conductivity type, having a polarity that is opposite to the polarity of the first conductivity type, such as p+, for example, is implanted into the masked area. The p+ implanted material is then driven by diffusion to extend over an area with edges that substantially correspond to the extent of the accumulation area in the substrate.

The gate structure is then overlaid with an insulator 455, as discussed above. A metal layer 460 is then formed over the insulator and extended to the source regions 430, to provide electrical contact to the source regions. In operation, a charge applied to the gate will cause the greatest current flow between the sources through the channels, while charge in the accumulation area is repelled by the opposing polarity of the second conductivity type formed above it. In this way, the capacitive charge built up in the accumulation area is minimized within a given range of current.

In exemplary preferred embodiments of either the trench or planar DMOS structures, the n-type portion of the gate structure is formed by implanting ions of either arsenic or phosphorous into the polysilicon. The p-type portion of the gate structure is preferably formed by implanting ions of boron into the polysilicon. It should be understood, however, that other dopants may be implanted into the gate structure of the present invention to produce the desired conductivity profile, as described above with reference to FIGS. 5 and 6.

Figure 7:
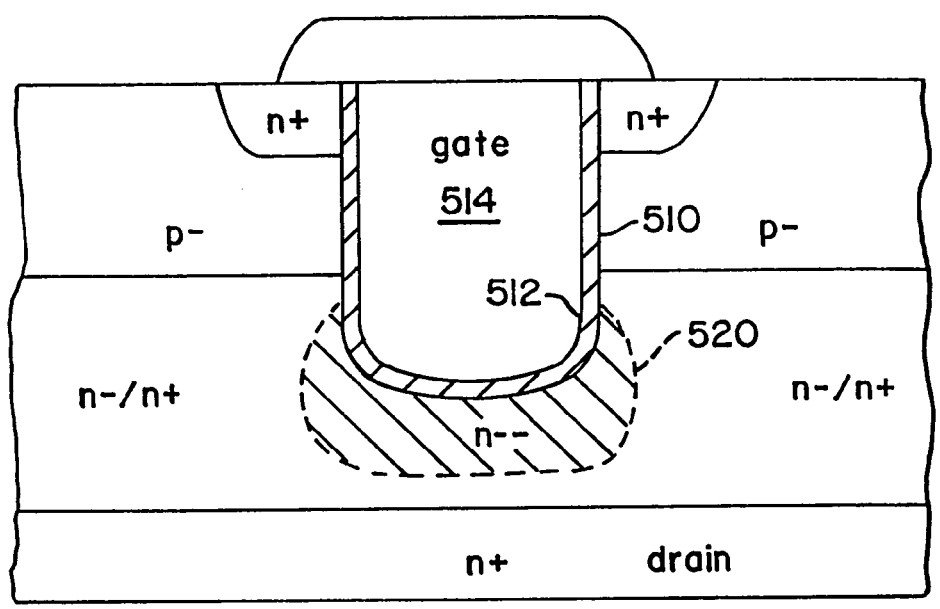
FIG. 7 is a simplified cross section of a trench DMOS transistor according to an alternative embodiment of the invention.
Figure 8:
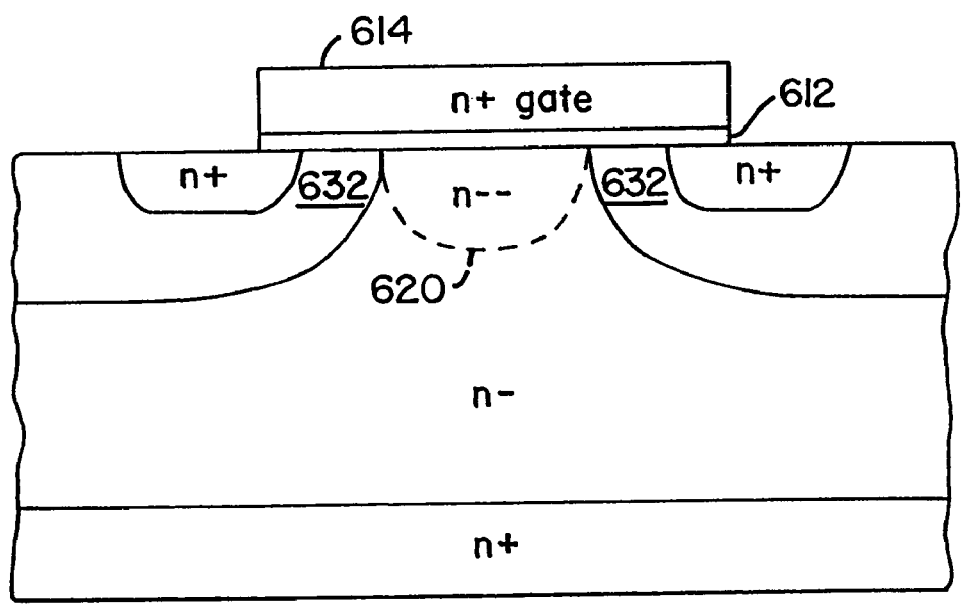
FIG. 8 is a simplified cross section of a planar DMOS transistor according to an alternative embodiment of the invention.

The present invention mitigates a build up of charge in the accumulation area proximate the gate structure of a DMOS transistor cell. In an alternative embodiment, as illustrated in FIGS. 7 and 8, the present invention provides an implant region into the epitaxial layer just underneath the gate between channel regions of two transistor cells. The alternative embodiment of the invention is adaptable to both the trench and planar configurations.

Figure 1:
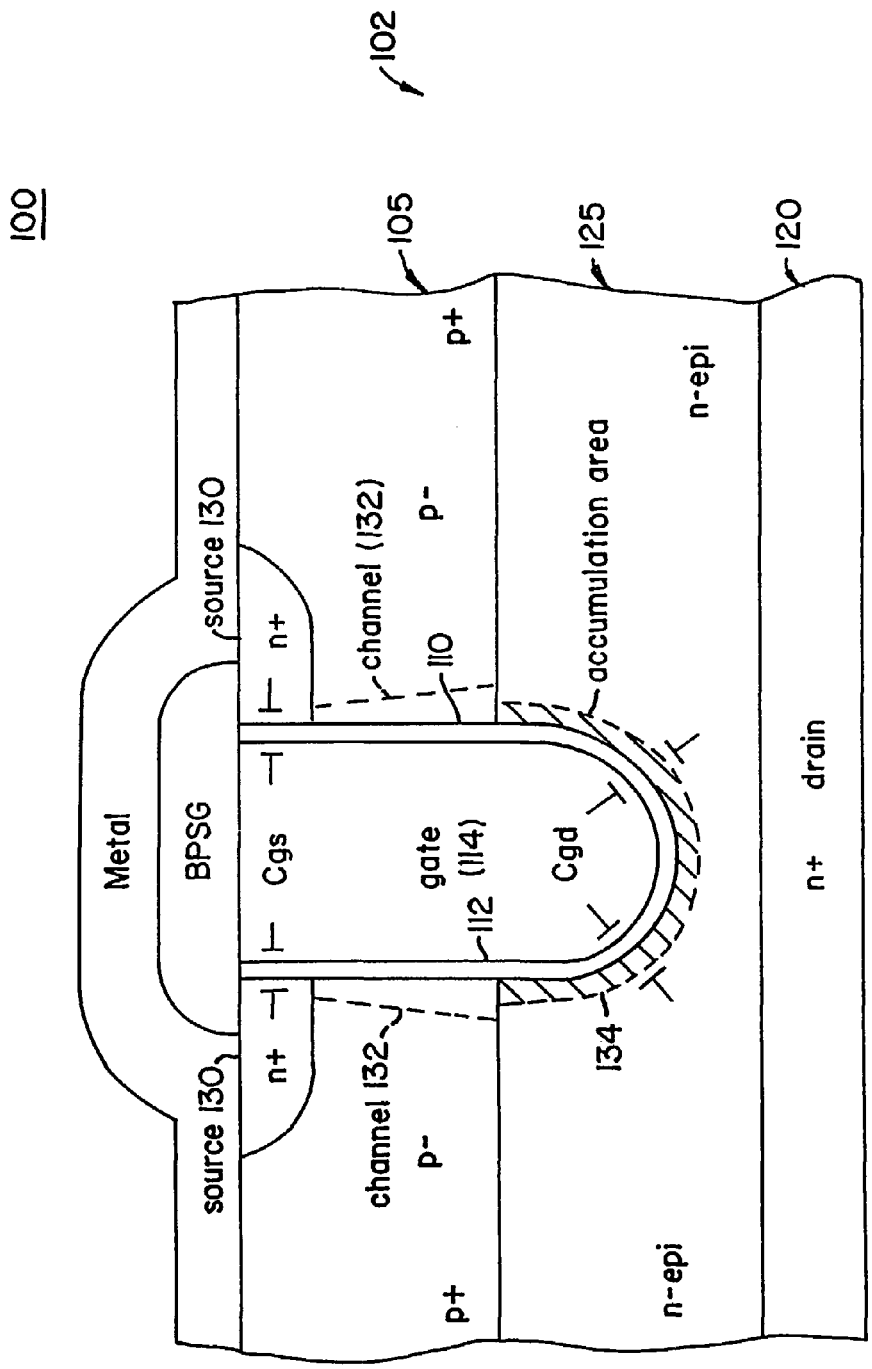
FIG. 1 is a simplified cross section of a conventional trench DMOS transistor.
Figure 2:
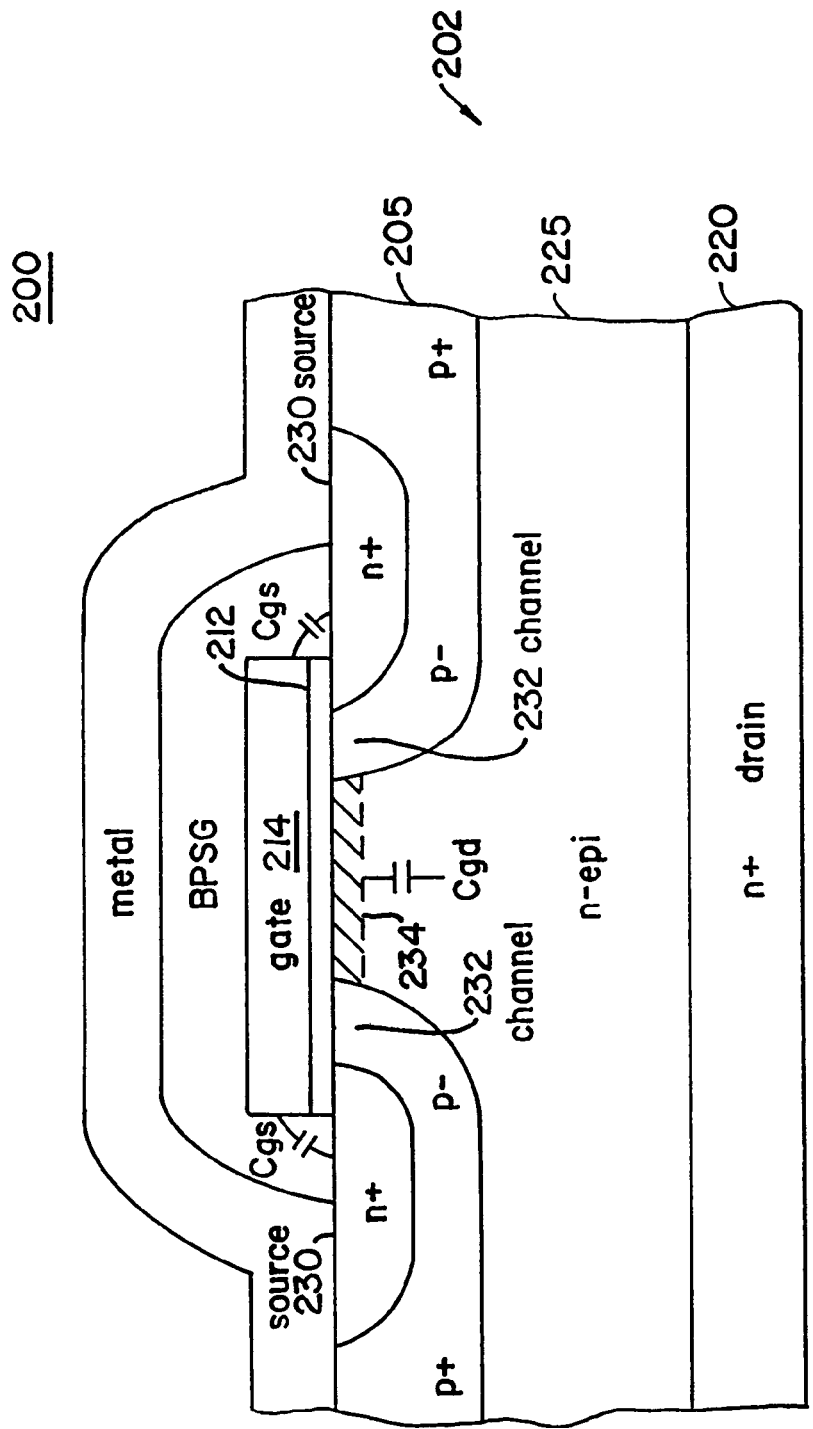
FIG. 2 is a simplified cross section of a conventional planar DMOS transistor.
Figure 3:
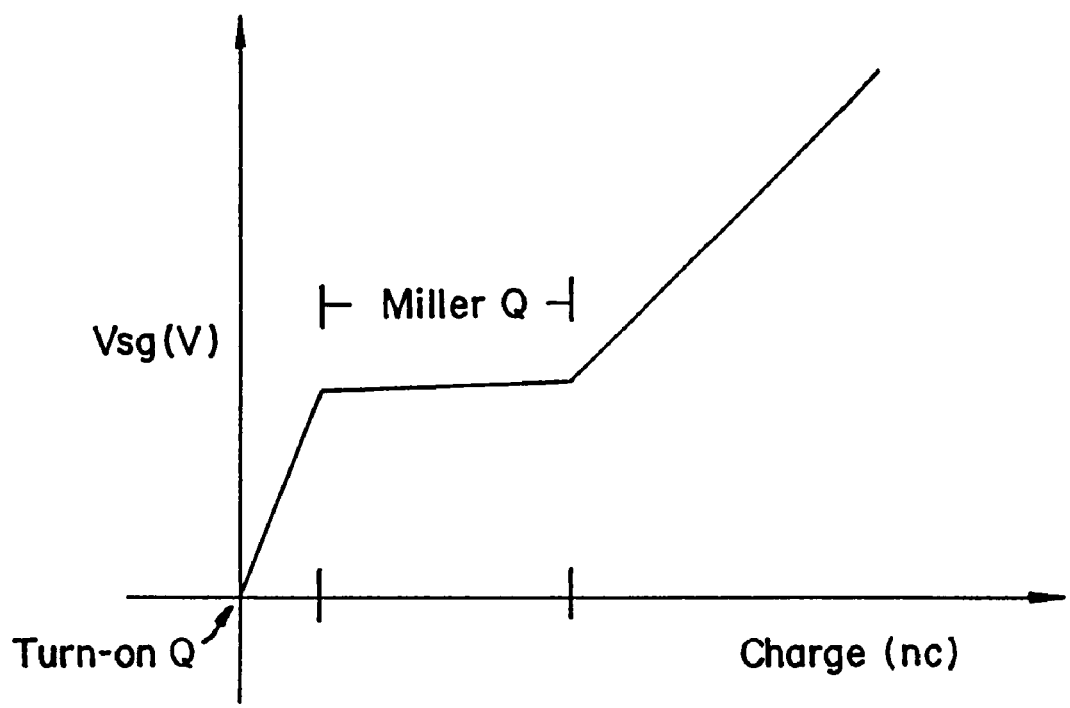
FIG. 3 shows a gate charge-gate voltage (QV) curve for conventional MOS devices.
Figure 4:
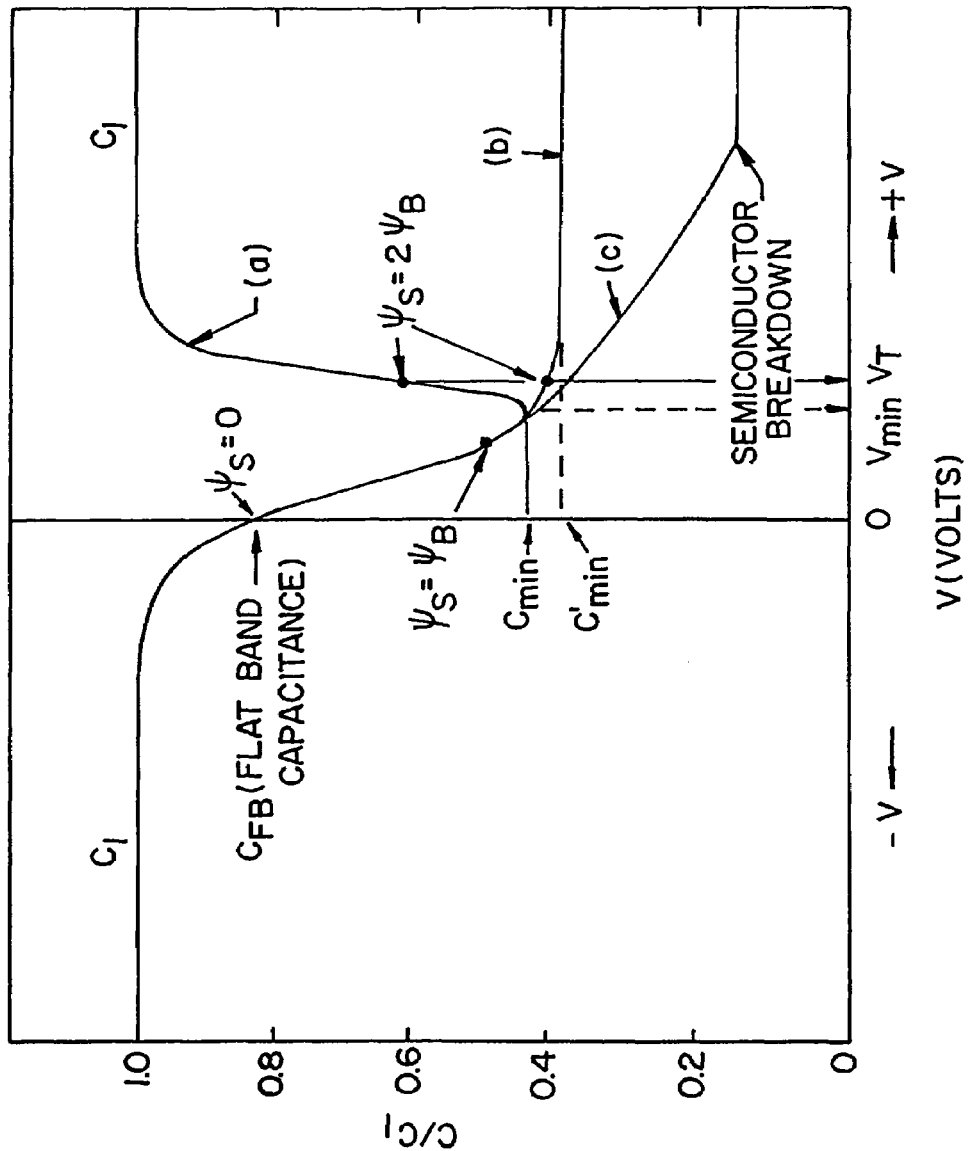
FIG. 4 is a capacitance-voltage curve (CV) for conventional MOS devices.

With reference to FIG. 7, there is illustrated a simplified cross section of a trench DMOS transistor 500, showing only the improved structure of the present invention. The DMOS transistor includes a trench 510 formed into a semiconductor substrate as described above in detail. A gate oxide 512 and a gate 415 may be disposed in the trench 510. At the bottom of the trench 510, in the area of the epitaxial layer where the accumulation area is formed, as shown in FIG. 1, an implant area 520 is formed as a lightly doped region. The implant area has a cross-sectional profile that surrounds the bottom of the trench at least within the n− epitaxial layer.

The implant area may be formed in one of several ways. Once the trench is formed, p-type ions may be implanted directly into the bottom of the trench, in a zero-angle ion implant step. Once implanted, the device is subjected to a drive step to diffuse the p-type ions out from the trench into the epitaxial layer. The drive step is preferably accomplished by annealing the transistor, then driving it at approximately 900-1500 degrees F., to diffuse the ion atoms. The resultant implant area preferably exhibits a Gaussian profile concentration. Or, the drive step can include multiple implant steps, until a desired implant profile is achieved.

FIG. 8 illustrates an implant area 620 in a planar DMOS transistor 600, to counteract the adverse effects of the Miller capacitance near a gate structure 614 of the transistor. The implant area is formed by an ion implant of p-type atoms into the accumulation area, between channel regions 632 underlying the n+ source regions. The implant area is preferably formed by masking an area of the semiconductor substrate surface, after p-type implant to form the channels. Then, the p-type material is implanted into the masked area. Next, the implant is driven to a desired profile, preferably extending to each channel region. The n-type material should have a higher density at the surface of the substrate. After the implant area is formed, the gate structure may be formed by employing conventional fabrication techniques.

While the above is a complete description of specific embodiments of the present invention, various modifications, variations, and alternatives may be employed. For example, although a silicon is given as an example of a substrate material, other materials may be used. The invention is illustrated for a two-transistor cell DMOS FET, but it could be applied to other DMOS structures, such as a multi-cell array of DMOS transistors on a single substrate. Similarly, implantation is given as an example of providing dopants to the substrate, but other doping methods, such as a gas or topical dopant source may be used to provide dopants for diffusion, depending on the appropriate mask being used. These and other alternatives may appear to those skilled in the art; hence, the scope of this invention should not be limited to the embodiments described, but are instead defined by the following claims.

What is claimed is:

1. A method comprising:
    (a) forming a body region of a first conductivity type in a semiconductor substrate having a drain region of a second conductivity type;
    (b) forming a source region of the second conductivity type in the body region;
    (c) forming a trench with a bottom and walls in the semiconductor substrate;
    (d) implanting ions of the first conductivity type into the bottom of the trench using a zero angle ion implantation process to form an implant region within the drain region such that the implant region is of the second conductivity type but has a lower doping concentration than a doping concentration of the drain region;

(e) performing a high temperature process to diffuse out the implanted ions such that the implant region surrounds the bottom of the trench and extends up the walls of trench but does not contact the body region; and (f) forming a gate in the trench such that the implant region overlaps the gate along the walls of the trench.

2. The method of claim 1 wherein the step of performing the high temperature process comprises annealing.

3. The method of claim 1 wherein the high temperature process is carried out at a temperature in the range of about 900-1,500° F.

4. The method of claim 1 wherein the source region is formed adjacent to upper portions of the trench walls.

5. The method of claim 1 further comprising forming a gate dielectric along the walls of the trench prior to forming the gate.

6. The method of claim 1 wherein the drain region comprises a first doped region and a second doped region, the first doped region extending under and having a higher doping concentration than the second doped region.

7. The method of claim 6 wherein the implant region is fully embedded within the second doped region of the drain region.

8. The method of claim 6 wherein the trench extends into and terminates within the second doped region.

* * * * *